(12) United States Patent
Pascucci et al.

(10) Patent No.: US 7,649,778 B2
(45) Date of Patent: Jan. 19, 2010

(54) METHOD FOR ACCESSING IN READING, WRITING AND PROGRAMMING TO A NAND NON-VOLATILE MEMORY ELECTRONIC DEVICE MONOLITHICALLY INTEGRATED ON SEMICONDUCTOR

(76) Inventors: Luigi Pascucci, Via Ferrara, 86, Sesto San Giovanni (IT) 20099; Paolo Rolandi, Via G. Parini 1, Voghera (IT) 27058

( * ) Notice: Subject to any disclaimer, the term of this patent is extended or adjusted under 35 U.S.C. 154(b) by 0 days.

(21) Appl. No.: 12/409,740

(22) Filed: Mar. 24, 2009

(65) Prior Publication Data
US 2009/0180328 A1 Jul. 16, 2009

Related U.S. Application Data

(62) Division of application No. 11/561,799, filed on Nov. 20, 2006, now Pat. No. 7,529,881.

(30) Foreign Application Priority Data

Nov. 18, 2005 (EP) .................................. 05425814

(51) Int. Cl.
*G11C 16/04* (2006.01)

(52) U.S. Cl. .............................. 365/185.17; 365/185.18
(58) Field of Classification Search ............ 365/185.17, 365/185.18, 189.2
See application file for complete search history.

(56) References Cited

U.S. PATENT DOCUMENTS 7,423,918 B2 * 9/2008 Royer ..................... 365/189.18

* cited by examiner

*Primary Examiner*—Vu A Le
(74) *Attorney, Agent, or Firm*—Trop, Pruner & Hu, P.C.

(57) ABSTRACT

A method for accessing, in reading, programming, and erasing a semiconductor-integrated non-volatile memory device of the Flash EEPROM type with a NAND architecture having at least one memory matrix organized in rows or word lines and columns or bit lines, and wherein, for the memory, a plurality of additional address pins are provided. The method provides both an access protocol of the asynchronous type and a protocol of the extended type allowing to address, directly and in parallel, a memory extended portion by loading an address register associated with the additional pins in two successive clock pulses. A third multi-sequential access mode and a parallel additional bus referring to the additional address pins are also provided to allow a double addressing mode, sequential and in parallel.

5 Claims, 7 Drawing Sheets

| Left | Pin | | Pin | Right |
|---|---|---|---|---|
| Vcc | 1 | | 70 | PA |
| A_11 | 2 | | 69 | #CE |
| A_10 | 3 | | 68 | A_12 |
| A_9 | 4 | | 67 | A_13 |
| A_8 | 5 | | 66 | A_14 |
| Vss | 6 | | 65 | A_15 |
| A_7 | 7 | | 64 | Vcc |
| A_6 | 8 | | 63 | A_16 |
| A_5 | 9 | | 62 | NC |
| A_4 | 10 | | 61 | NC |
| A_3 | 11 | | 60 | NC |
| A_2 | 12 | | 59 | NC |
| A_1 | 13 | | 58 | NC |
| NC | 14 | | 57 | Vcc |
| NC | 15 | | 56 | DU |
| NC | 16 | | 55 | Vss |
| NC | 17 | | 54 | NC* |
| NC | 18 | | 53 | NC* |
| NC | 19 | X16 | 52 | Vss |
| NC | 20 | | 51 | PRE |
| NC | 21 | | 50 | C&A |
| NC | 22 | | 49 | ALE |
| NC | 23 | | 48 | #WE |
| R/P | 24 | | 47 | #WP |
| #RE | 25 | | 46 | DQ/O15 |
| DQ/O0 | 26 | | 45 | DQ/O7 |
| DQ/O8 | 27 | | 44 | DQ/O14 |
| DQ/O1 | 28 | | 43 | DQ/O6 |
| DQ/O9 | 29 | | 42 | Vss |
| Vcc | 30 | | 41 | DQ/O13 |
| DQ/O2 | 31 | | 40 | DQ/O5 |
| DQ/O10 | 32 | | 39 | DQ/O12 |
| DQ/O3 | 33 | | 38 | DQ/O4 |
| DQ/O11 | 34 | | 37 | Vss |
| Vss | 35 | | 36 | Vcc |

FIG. 1B by 16_Output Seq/Parallel Multi_Purpose_Read Address Protocol

| l=least Add<br>m=middle Add<br>M=most Add<br>X=D'ont care | a_SYNC | PARALLELL<br>SYNC | | SEQ<br>SYNC |
|---|---|---|---|---|
| | a_Sync | Extended | Maxi | NAND_Port |
| Add_Vector | 16 | 32(16+16) | {23(16+8)+16} | 40 |
| #Rd | ‾‾\_/‾ | ‾‾‾\_/‾ | ‾‾‾‾\_/‾ | ‾‾‾\_/‾ |
| PA | 1 | 1 | 1 | 0 |
| Add <1-16> | Xl | Xm Xl | X Xl | X |
| ALE | 0 | 0 | 0 | 1 |
| #WR | 1 | 1 | 1 | 1 |
| I/O <0-7> | —X L_Data | —X L_Data | —X L_Data | √1 ··· √5 |
| I/O <8-15> | —X H_Data | —X H_Data | M —X H_Data | Xl → XM |
| No_Cy | 0 | 1 | 1 | X |
| Add_ble Mem (Max_Size) | 1_Mega | 64_Giga | 16_Tera | 16_Tera |

FIG. 2

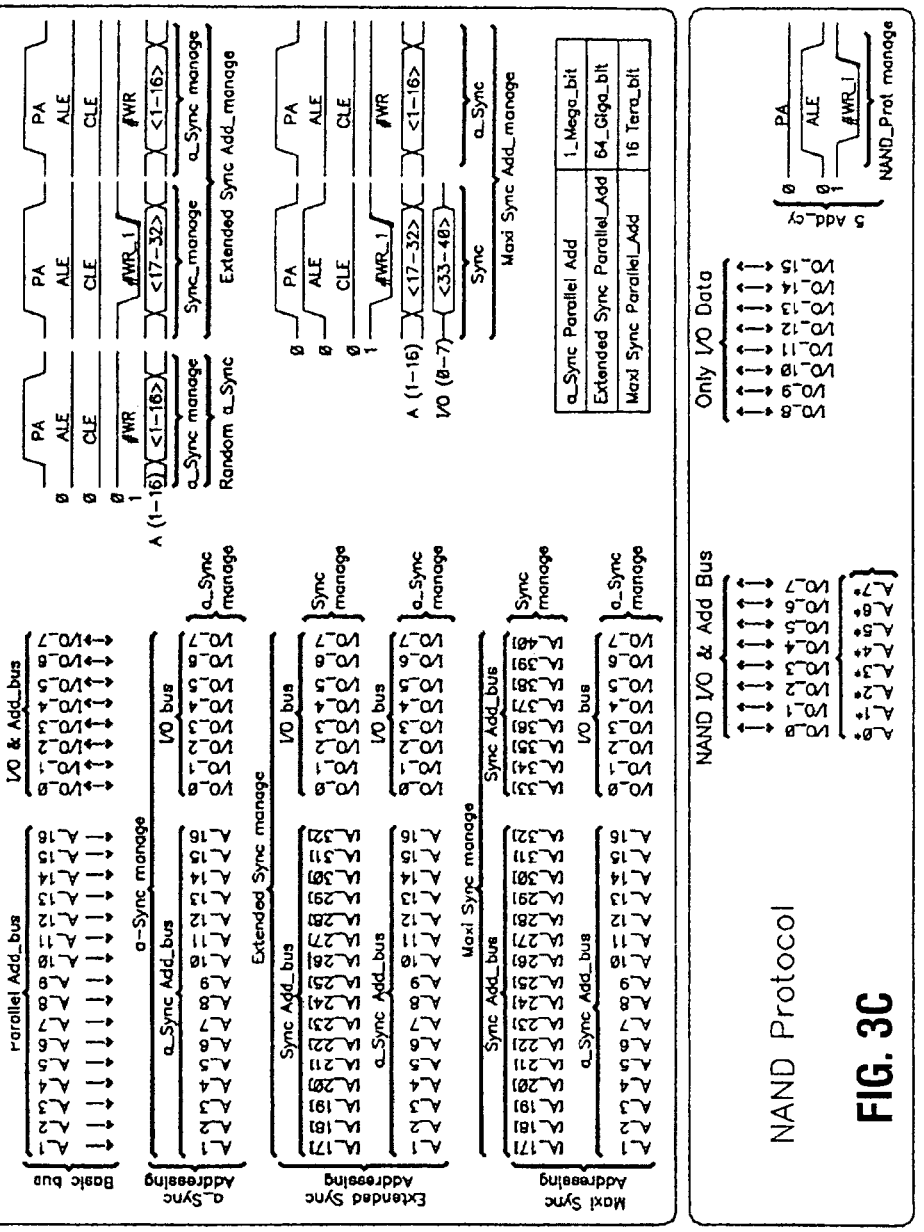

METHOD FOR ACCESSING IN READING, WRITING AND PROGRAMMING TO A NAND NON-VOLATILE MEMORY ELECTRONIC DEVICE MONOLITHICALLY INTEGRATED ON SEMICONDUCTOR

CROSS-REFERENCE TO RELATED APPLICATIONS

This application is a Divisional of U.S. patent application Ser. No. 11/561,799, filed on Nov. 20, 2006 now U.S. Pat. No. 7,529,881.

BACKGROUND OF THE INVENTION

1. Field of the Invention

The present invention relates to a method for accessing, in reading, writing and programming, to a monolithically semiconductor-integrated memory electronic device of the Flash EEPROM type with NAND architecture comprising at least one memory matrix organized in rows and columns of memory cells.

2. Description of the Related Art

It is known that the market of non-volatile memories, for example of the EEPROM or Flash EEPROM type, is currently growing and the most promising applications relate to the "data storage" field.

Until recently, the market almost exclusively involved the consumer field of digital cameras, with the support cards or the known USB keys that represent expandable mobile memories for personal computers.

Therefore, the demand for these products by the consumer was mainly addressed to flash memories of large capacity.

This trend appears to continue in the coming years by virtue of newer applications of the portable electronic devices, which require greater memory capacity, for example for digital cameras or for mobile phones of the last generation operating for example according to the standard 3G or UMTS.

For these applications Flash memories having several advantages in terms of low power consumption, quiet operation, reduced space, etc., and would seem to be particularly suitable.

As is known to the skilled person in the art, Flash memory architectures utilize two fundamental structures, the first of which refers to the traditional and widely tested NOR architectures, and the second one is the more innovative and promising NAND architecture.

For the previously cited applications, the flash architecture most suitable for the requirements of low power consumption, high density, and high program and erase speed is that of the NAND type, which handles, in a simple and fast way the largest amounts of "synchronous" data in reading and programming.

Although having the feature of a high data modify speed, such NAND memories do not allow a fast random access to the same since they are designed for entire pages of at least 512 bytes and not of the single bytes.

In fact, the NAND access protocol is quite slow in random access due to the known latency time, and it exhibits serious difficulties for accessing a sector or a page in a random way.

To meet the increasing needs of portable electronic devices, it would be necessary to have in a same memory also an excellent random access time, such as to perform the code or the boot of the operative system or of the programs without the burdensome use of a PAM.

The fact is also to be taken into consideration that the lithographic sizes for the manufacturing of non volatile memories have reached lower limits of about 65 nm, or even of 32 nm, such as not only to make the construction of the interface between the decoding circuitry and the matrix of the cells themselves difficult, but also such as to enormously increase the propagation times of the signals due to the length of the lines.

In this respect, an important role is played by the row decoding circuitry, whose architecture conditions both the size and the time of the memory access. This is particularly true where the row lines reach extreme compactness levels, especially in NAND Flash, and the problem becomes exacerbated and the implementation becomes complex to such an extent as to make the area occupation inefficient.

The programming and erasing operations occur by exploiting the Fowler-Nordheim phenomenon, while the reading is an operation of the dynamic type. Now, also due to this the reading step is slowed substantially.

It is to be remembered that in a sector of the NAND type, the minimal erasing unit consists of a group of word lines equal to the number of cells of the stack included between the lines SSL and DSL intercepting them, i.e., 16 or 32 according to the memory sizes.

This implies that each stack elemental structure has a reduced conductivity, thus being a strong limitation for the reading structure. The conventional stack structure (16, 32 cells) thus exhibits intrinsic slowness since it has low capacity.

In addition, current NAND memories do not carry out an operative code, for example of the XIP type, since the random access time typical of these architectures is on the order of 10-20 usec.

The reasons for this slowness are due to different components of the memory:

a) to the particular organization of the matrix that normally comprises groups of 16/32 cells in series, which greatly decreases the conductivity of each group;

b) to the great number of wirings of the elemental groups along a same bit-line which increases its load, thus resulting in substantial latency;

c) to the NAND protocol which, conventionally, is oriented to the reduction of the terminals and to a sequential management both of the commands and of the data.

The burden of the load due to the bit line BL is greater than in the corresponding NOR-Flash since in the NAND-Flash the generic bit line BL collects the capacities of all the stack structures which, combined with the large capacities of the memory, significantly increase the value thereof.

BRIEF SUMMARY OF THE INVENTION

The present disclosure overcomes the foregoing drawbacks by adopting an innovative matrix architecture and by adopting a protocol for accessing the memory which, by allowing addressings of the random type in a substantially direct and immediate way instead of sequential, provides substantial improvement in the performance of the device, both in terms of response speed and in terms of data addressing easiness.

The present design also provides a method for accessing, in reading, writing and programming, a memory device of the type indicated and having such features as to simplify the modes of accessing the memory and overcoming the limits and the drawbacks of prior designs.

The present design includes a memory integrated architecture preferably having two areas or portions with different data storage capacity and different access speed that also have a continuity between the structures of bit lines and share both the reading and programming resources that maintain the same protocol and operative management procedures and that tolerate different propagation and conductivity times in the two sections.

In accordance with one embodiment of the invention, a method is provided for accessing in reading, programming, or erasing phases to a semiconductor-integrated non volatile memory device of the Flash EEPROM type with a NAND architecture having at least one memory matrix organized in rows or word lines and columns or bit lines, and providing, for the memory, a plurality of additional address pins and providing both an access protocol of the asynchronous type and a protocol of the extended type. The method includes addressing, directly and in parallel, a memory extended portion by loading an address register associated with said additional pins in two successive clock pulses.

In accordance with another embodiment of the invention, a method for accessing a NAND non-volatile memory matrix is provided. The memory matrix is organized in rows and columns and accessed by word lines and bit lines, respectively. The memory includes first and second submatrices with bit lines coupled by a switch device between the first and second submatrices, with the first submatrix having a faster speed of operation and higher capacity bit lines than the second submatrix. The method includes storing, reading, or deleting code in the first submatrix; and storing, reading, or deleting data in the second submatrix.

In accordance with another embodiment, a method for accessing is provided, the method including accessing a semiconductor integrated non-volatile memory device of the flash EEPROM type with a NAND architecture having at least one memory matrix with a memory extended portion and a plurality of address pins associated therewith. The method further includes accessing the memory matrix utilizing an access protocol of the asynchronous type and using a protocol of the extended type to address, directly and in parallel, the memory extended portion by loading an address register associated with the address pins in two successive clock pulses.

BRIEF DESCRIPTION OF THE SEVERAL VIEWS OF THE DRAWINGS

The features and the advantages of the memory electronic device and of the relative programming method according to the invention will be apparent from the following description of an embodiment thereof given by way of indicative and non-limiting example with reference to the annexed drawings.

FIG. 1B shows a semiconductor package schematic view inherent in the memory device of FIG. 1A with the main input/output pins highlighted;

FIG. 2 is a table illustrating, in synthesis, the composition of the cycles in the different access modes in reading of the memory device according to the invention;

FIG. 3A shows the structure of the address and data buses and their meaning according to the different operation modes provided by the protocol for an EEPROM memory with NAND architecture, realized according to the present invention;

FIGS. 3B-3C show the structure of the address and data buses of the memory in the operation mode with a NAND protocol for the device of FIG. 1A;

DETAILED DESCRIPTION OF THE INVENTION

Figure 1A:
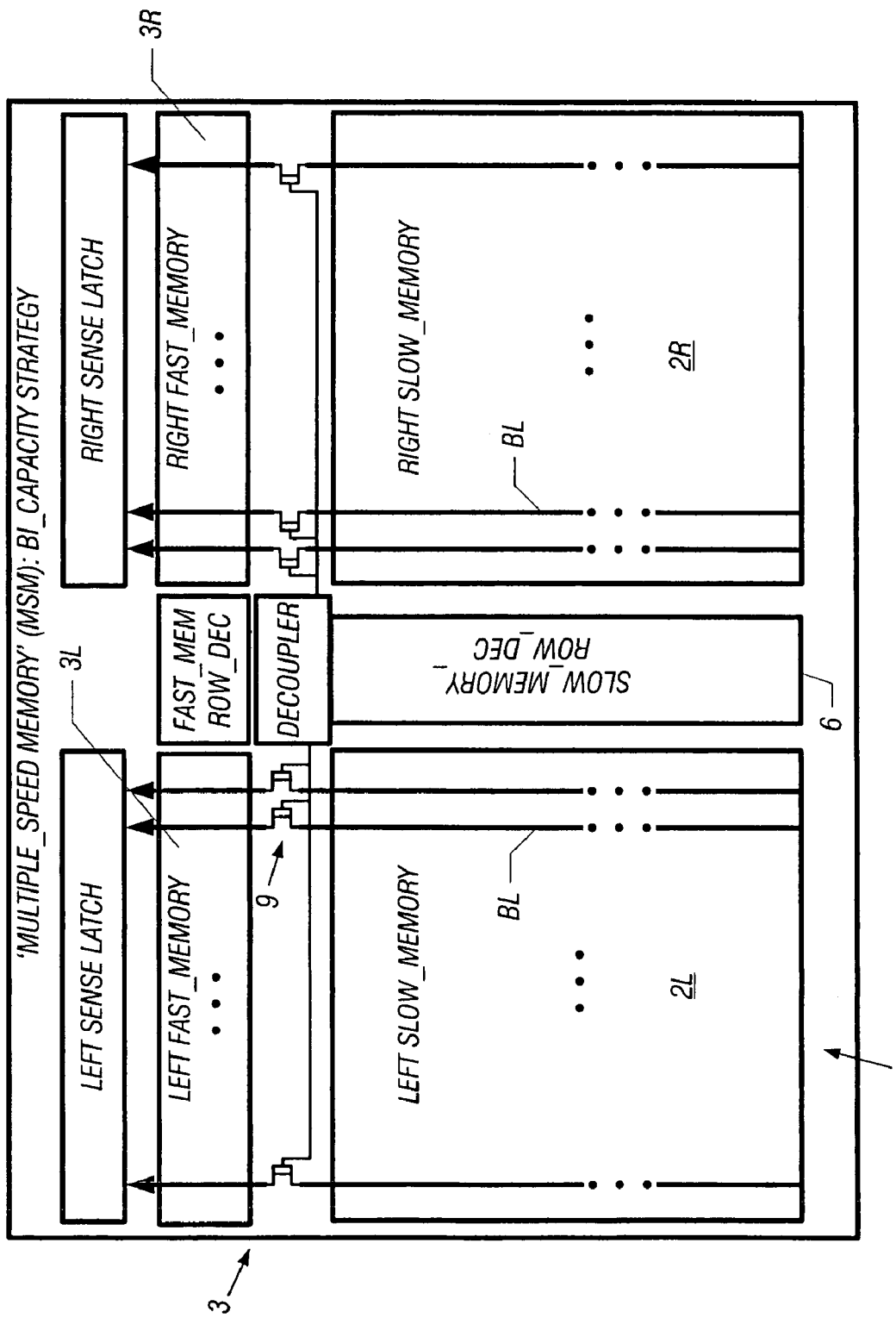
FIG. 1A shows a preferential schematic view of a memory electronic device, in particular an EEPROM memory with NAND architecture realized according to the present invention.

With reference to these figures, and in particular to the example of FIGS. 1A-1B, shown therein is a new memory electronic device 10 realized according to the present invention and monolithically integrated on semiconductor. The device 10 incorporates at least one matrix 5 of memory cells organized in rows or word lines WL and columns or bit lines BL. The device 10 is however a memory of the Flash EEPROM type with an architecture of the NAND type.

The present design and method provide, at the expense of a light modification of the array of a NAND memory, realization, in a single chip and thus with a single technology, of a group of functions typical of different memories and up to now obtained only through devices of a different nature and structure. In other words, the device 10 is implemented on a single chip and integrates both the "hard disk" and boot ROM functions, avoiding resort to the assembly of several components coming from different technologies, even if the devices are on a same package.

FIG. 1B thus shows a schematic view of an electronic memory device 1, in particular an EEPROM memory with NAND architecture implemented according to the invention. This type of architecture provides a very ordinate structure of memory cells subdivided into two submatrices, left L and right R, referring to a single row decoding block generally arranged in a central position in the device 1.

Each one of the left and right submatrices corresponds to a bank of registers of the read amplifiers or sense amplifiers.

Due to this particularly ordinate structure, the area of the array is reduced and significant memory capacities can be easily obtained.

Advantageously, according to the present invention, inside a same sub-matrix L or R a smaller or reduced fast portion 3 of the sub-matrix is made, for example having sizes equal to 32 Megabit or 64 Megabit on an overall 1 Gigabit matrix.

For example, it is possible to provide the various logic sectors of the fast portion 3 with each sector having eight rows (4+4 wired) and 16k columns for a total of thirty-two sectors suitable to form a memory of 8 Mbit per code storage. While in the second portion 2 1024 sectors of 16 rows and 16k columns for a total of 1 Gbit of data storage can be provided.

In consequence of this subdivision, two portions 2 and 3 can be obtained whose bit lines BL have significantly different sizes and capacitive weights, for example, short and light for the fast portion 3, long and heavy for the slow portion 2.

Moreover, the fast portion 3 is advantageously placed immediately close to the register and reading structures, and it operates at a speed being definitely higher than the classical NAND, i.e., with access times comparable to the highest performing architectures of the NOR type.

Hereafter reference will be made to one sub-matrix L, R only, using for it the word matrix. As it can be appreciated from the example of FIG. 1A, the matrix portion 3, called hereafter "fast," is contiguous to the main matrix portion 2 called "slow," against which it has the further function of connection with the read and modify interfaces.

This peculiarity provides two important advantages. It ensures size compatibility and continuity of the lines crossing the different matrix portions, and it reduces the load for the fast portion with the benefit of speeding up the pre-charge and verify operations.

Notably, the fast and slow portions, 3 and 2 respectively, have the same number of BL and each BL of the one is the continuation of the other in that the portions BL are separated only by a device_switch 9, i.e., a pass transistor switch or by a simple transistor. The device_switch 9 provides the "capacitive decoupling" of the BL of the fast portion 3 (short and light) from the BL of the slow portion 2 (long and capacitively heavy) easing, in consequence, the quickness of the fast portion 3. Therefore, anytime one operates on the fast portion 3, the device_switch 9 is made 'OFF'.

A further measure that can distinguish and improve the performance of the fast portion 3, even if not strictly necessary to the purposes of the present invention, is the adoption of "strap techniques" on the word lines, which allow the reduction of the propagation times of the selection signals.

Advantageously, the slow portion 2 is for the data storage, and it includes blocks compatible with the features of a non volatile memory of the Flash type which, although slow, allows a remarkable reduction in the occupation of circuit area. In other words, the portion 2 has a high density of memory cells. This portion 2 is associated with a row decoding circuitry 6 of its own.

With the code storage portion 3, a corresponding row decoding circuitry 7 is associated.

The cells of the fast portion 3 have the same electrical features of the cells of the "slow" portion 2, i.e., they are programmed and erased with identical modes, but they are organized so as to operate with a higher reading current.

The conductivity increase of the elemental AND structures of the fast portion is advantageously obtained by reducing the number of devices; for example only four transistors instead of 16 or 32, but it can also be accomplished in an alternative way, operating parallelisms on basis 2 or on basis 4.

The reduction of the number of the transistors in series provides a significant increase in the operation current.

With this measure, and reasonably supposing an operation in a linear zone, the current of the memory cells of the portion 3 increases until it reaches the theoretical value equal to at least eight times the current of the memory cells of the portion 2 designated for the data storage.

Within the present embodiment, it is to be noted that current NAND memories do not perform an operative code, for example of the XIP type, since the random access time typical of these architectures is on the order of 10-30 usec.

The reason for this slowness is due to the particular organization of the matrix normally comprising groups of 32 cells in series, which reduce the conductivity thereof, connected to each other through long selector lines subjected to significant slowness for the signal propagations.

Moreover, each physical sector refers, with its own elemental structure, to a generic bit line that therefore accumulates a considerable capacity value.

This capacity, combined with the very low conductivity of the elemental structures of a conventional NAND_Flash, is the reason for very long evaluation times. The idea of a single BL, which collects the nodes of all the intersected sectors, responds to compactness and minimization criteria of the BL, but it is disadvantageous and limiting for the dynamic aspect, which is extremely slow.

For a better comprehension of the advantages of the present design, set forth below are a series of features of the new architecture of Flash NAND memory electronic device 21:

a) a structure with at least two memory areas or portions with high speed difference;

b) the presence of a sub-system with performance comparable to a data memory;

c) the presence of one or more memory portions with very fast random access and comparable to a memory of the NOR type;

d) the sharing of the functional structure for minimizing the circuit area occupation;

e) the same word line length (even if with different propagation times) and, in the meantime the same number of bit lines;

f) the size equivalent to a memory specifically adapted to the data storage function;

g) the features of a conventional data memory in terms of: protocol compatible with that of a conventional data memory and array efficiency (array/die ratio) of a conventional data memory;

h) a number of masks employed in the manufacturing process of the integrated circuit equal to those typically employed for a process of the NAND type, with the advantage of employing a more easily reproducible technology with respect to a Flash NOR and therefore such as to ensure greater yield;

k) a lower silicon consumption with respect to the solutions proposed by the known technique in terms of MCP;

l) a lower consumption of current; and m) the possibility of programming the memory in the page mode with at least 512 Byte.

This set of advantages is the result of the new NAND memory architecture, which will also be of the Multi Speed type, as it will be clear from the following description of the access method in reading, writing, and programming.

According to the present disclosure, a selection of the matrix rows is also provided so as to minimize the decoding network and facilitate the realization of the memory device.

In fact, in the memory device 10 each single sector, which will be hereafter defined "logic sector," incorporates groups of wired word line obtained by short-circuiting with each other pairs of "homologous" word line. Two and four are the most advantageous multiplicity, although multiplicities of eight and more can be utilized.

Figure 3B:
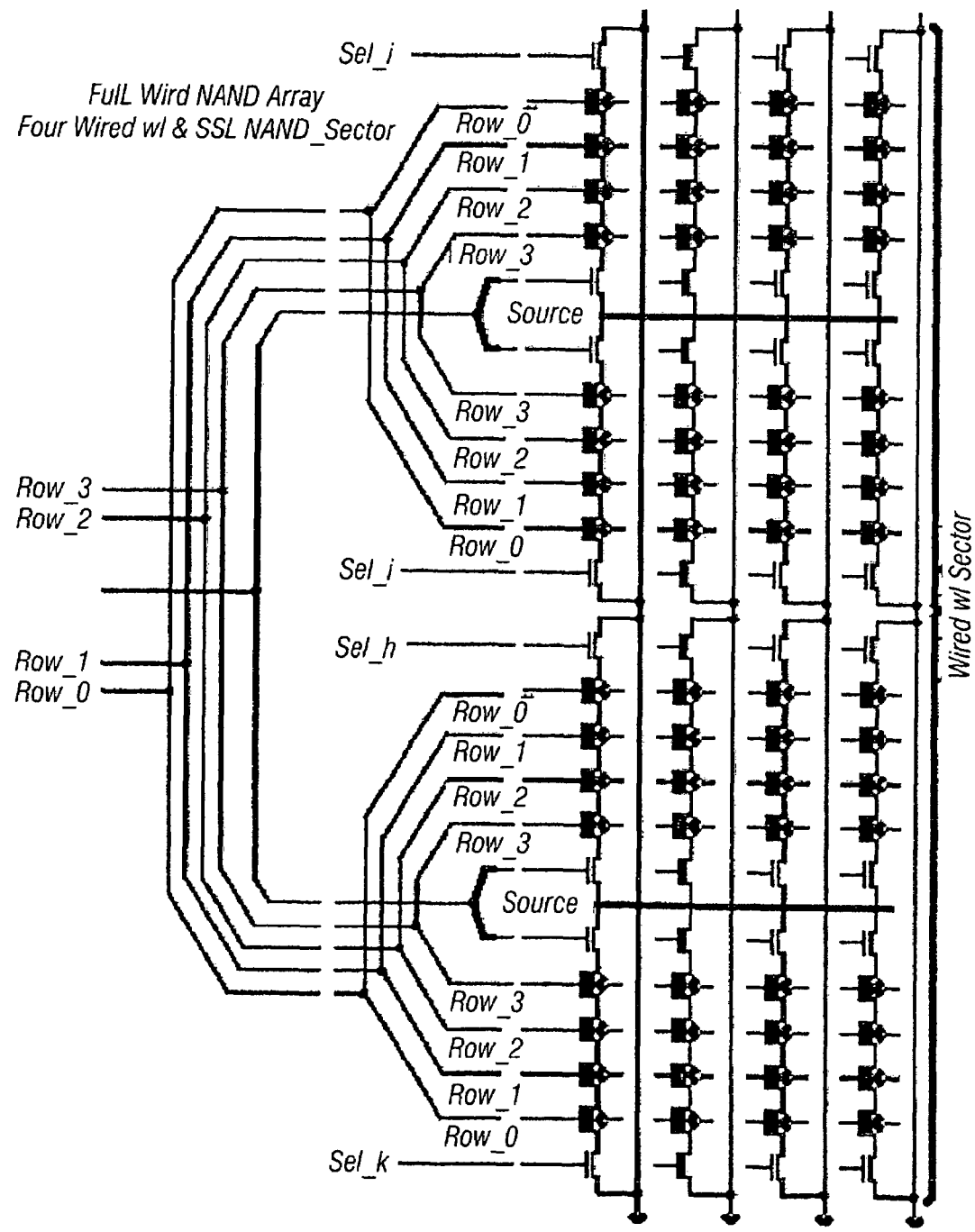
Figure 4:
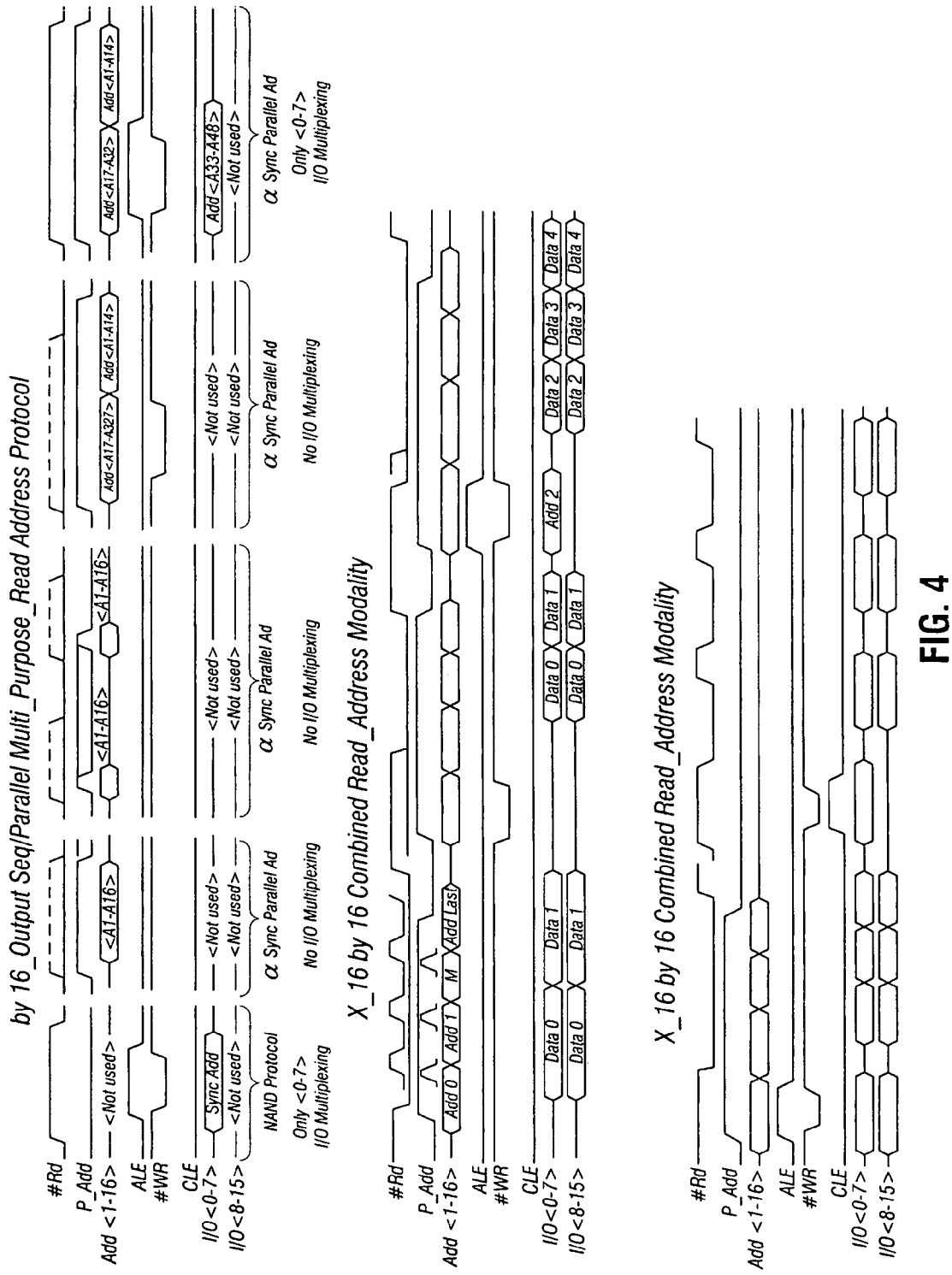
FIG. 4 shows the fundamental timings and some possible combinations of the protocol according to the invention in the various sequential or parallel access operative conditions.

For example, FIGS. 3B and 3C show the wiring of word lines wherein the first row of a physical sector has been short-circuited with the last row of an adjacent physical sector obtaining a logic sector that becomes for this architecture the smallest unit that is entirely erasable.

Obviously, nothing forbids that this coupling can occur with different association modes between pairs of word lines. For example, the n-th row of a physical sector can be short-circuited with the n-th row of the adjacent physical sector, i.e., with the row having the same position within the adjacent physical sector.

It is thus understood how the possible coupling combinations are numerous.

Moreover, these examples are valid in the case wherein a multiple of two has been chosen for the coupling of the word lines of a given logic sector, thus coupling the word lines in pairs.

The association process can be extended to all the physical sectors and with the desired multiplicity.

It should be noted that in the architecture of the present design, only one sector SSL_ij of source line SL is provided for each pair of adjacent physical sectors, i.e., one single SSL for each logic sector. Whereas more drain selectors (DSL) are provided according to the implemented wiring multiplicity. With this measure, the single logic sector (which can be functionally defined as such) comprises all the groups having the wired WL. Thus, there is a fundamental difference between the definition of logic sector according to the present invention and a physical sector of a conventional matrix.

A consequence of this feature is that the sizes of the logic sectors between the two portions 2 and 3 can be different since the elemental structure of the same portions is different. The portion 3 is characterized by smaller logic sectors. In this way the granularity with respect to the erasing is thus greater, and this is a further advantage of the present design.

The unity of the selection of a given cell is thus ensured by the drain selector, which must be maintained distinct for preserving the univocality of the row decoding operation. In FIG. 32 the presence of the upper drain selector SEL_i and lower SEL_j is to be noted.

With this technique the matrix rows are biased at least in pairs or in groups of four, eight etc., according to the multiplicity of association and grouping of the word lines.

It should be understood that the wiring between more WL reduces the number of the drivers necessary to stimulate the selection of the different selection lines.

Obviously, the greater the number of wiring of the word lines, the wider is the facilitation of the structures that interface the matrix. In consequence, with this wiring method the criticality imposed by the smallest size of the row lines is completely eliminated, which implies a high number of interconnections and the fragmentation of the same decoding network.

To better understand the aspects of the access method in reading, writing, and programming of the present design, it is worth examining the biasing modes of the memory cells of the matrix 2 in the various access steps.

Therefore, the present disclosure also provides a programming method of the memory device 10 providing that each programming step of one or more cells in parallel is preceded by an inhibition step of the programming step obtained by activating all the drain selection lines DSL containing the word line or lines involved in the programming, and by forcing a simultaneous precharge of all the channels of the cells of a given logic sector.

A successive programming step provides the de-selection of all the drain selection lines DSL not associated with the package containing the cell in the modify step. Moreover, the pattern to be programmed is simultaneously configured by forcing a potential of 0 V on the bit line BL of the cells to be programmed and maintaining the precharge potential on the channels of the cells whose content is not to be modified.

Pairs of drain selectors are provided according to the multiplicity for each logic sector. Differently, a single control terminal is necessary for the different source selectors of a generic logic sector since the same, being wired, are simultaneously stimulated without causing misoperations. Among the different stimulated source selectors, only the one aligned to the drain selector will be active.

The source selector of a logic sector is distinct from the corresponding source selectors of other logic sectors. With the same memory sizes, a logic sector of the memory according to the invention corresponds to at least one pair of physical sectors of a matrix with NAND architecture of the traditional type.

The device 10 thus exhibits very different functional and performance aspects with respect to the products of the traditional flash_NAND type. In fact the new memory incorporates slow functional parts, other fast and both enhanced by further improvements, which involve both flexibility aspects (addressing multiplicity) and of immediacy (possibility of random access both onto the entire memory and into any data array).

These new features suggest an enriched stimulus interface (Pin_Out), with respect to a traditional Flash_NAND, with a further address bus and a relative enable pin PA (parallel_Address). The new addressing structure adjacent to that typical of the traditional Flash_NAND has produced a new communication protocol.

Such protocol has been developed in such a way as to respect those features that optimize the performance of the device in terms of flexibility and compatibility, in particular:

Compatibility with the conventional NAND protocol for the read and modify operations (program and erase);

Random access of the NOR-like type for any sufficiently wide portion in any region of the memory;

Addition of a number of 16 pins for the implementation of an address bus with advantageously binary size and of a further pin (PA) having control function on the address mode;

"Parallel" mode with explicit request NAND protocol mode by default;

Configurability of the address vector with the feature of immediacy or at least of a single clock pulse in the "parallel" mode;

Invariance of the address bus size with respect to the memory sizes;

Synchronous and a_synchronous reading in the random parallel mode;

Address mode of the "address bus free" type;

Switchings between the various operating modes of the "command free" type;

Control signals of the NAND protocol;

A single control signal for switching between the various modes; and

The single non parallel read mode is by default the NAND one.

For completely exploiting the intrinsic potentialities of the architecture according to the embodiments disclosed herein, a suitable reading method is defined that can be flexible in order to pass from an operation mode to the other without resorting to burdensome (since made of more cycles) and slow command procedures. In this way the memory device 20 is seen by a processor with which it normally interacts as a single complex and integrated system of data, codes, information, and base commands storage for the operative system.

The various memory portions 2, 3 have been designed and organized to be read indifferently with all the modes (wherein the "NAND protocol" mode is the "mode by default"), except for the different operation speed, which depends instead on the matrix portion which is to be addressed.

The above mentioned features will be clearer from the following description.

By comparing the solution of the present embodiments with the known solutions, for example with the NAND memory of FIG. 1, it can be appreciated how such known memory device includes, besides the traditional pins of NAND architectures, a certain number (sixteen) of address pins and a further control pin (PA).

The addressing window equal to sixteen has been traditionally adopted for obtaining an efficient partitioning of the memory in terms of blocks, sectors, and sub-sectors, and in such a way that the signals can move inside the memory with simple and "identifiable" loadings of the address registers respectively corresponding to the block, to the sector, and to the selected sub-sector.

The memory device 10 according to the invention, in the parallel mode and in the portion of fast matrix, is capable of performances in reading of about.about. 100 nsec., which are typical of a NOR memory. Moreover, such device 10 keeps the writing and erasing and, in general, modifies performances of a typical NAND memory for data storage.

To meet these multiple needs, a specific control pin has been provided, shown in FIG. 1 and indicated with the acronym PA, which enables passing from a mode of the data storage type to a mode of the XIP type with a switch of "0->1", or "1->0" in the opposed case. This is accomplished without the need for added clock-and-wait cycles of the microprocessor that interacts with the memory.

It is worth noting that the data storage mode, which contemplates erase and write steps, makes use only of the traditional NAND protocol of the synchronous type, and it is essentially addressed to the use of the memory as data/files storage. In this case the control pin PA is kept at the logic level "0".

The device 10 can, however, operate also in the parallel access mode with address-datum immediacy features as in a traditional flash of the NOR type in any part of the memory, also comprised the data_storage section. In this context it is enough to place the pin PA to a logic level '1' and thus enable the sixteen additional address pins, at least for the whole time necessary for the parallel addressing.

This measure allows skipping the procedure of the NAND protocol, which is therefore suspended in parallel activity, and to enable a second bus (additional with respect to the conventional flash products of the NAND type) which, as said, allows acceding to the memory in reading with the feature of a flash memory of the NOR type.

Advantageously a second bus n A(1-16), shown in FIG. 3, includes 16 wires referring to the above additional address pins and it allows an immediate address of any word belonging to the matrix area localized by the remaining address vector (the most significant ones).

To understand the features and advantages of the present protocol it is important to observe that the NAND protocol expounds, by means of a data and address multiplexed bus, any addressing following two fundamental modes:

a) Sequential. This is the default mode. The counter, starting form an "origin" addressed location, at the end of each reading builds the successive address, increasing the previous one by '1'.

b) Random. This mode is possible only on demand, and it first recalls a "control" step (expensive in terms of time) and, subsequently, the complete definition of the whole address vector which, contemplating repeated and systematic loading cycles of the register designed for this function, implies system complexity and long times already in the sole preparation step.

It is evident that the management according to the NAND protocol is advantageous only in the natural use of sequential addressing (use of the memory as 'Mass Storage') while it is extremely complex and slow in the random mode (use of the memory as 'Execution_Code'). This mode requires parallelism and execution immediacy.

These features make the use of the sole NAND protocol unsuitable for the memory of the present embodiments.

The protocol provides the implementation of three fundamental parallel addressing forms whose operative cycles are illustrated in FIG. 2 and, more in detail with the timing, in 3.

The three addressing modes involve address vector portions progressively increasing due to the distance of the new reading area with respect to the position of the current one.

In detail the three addressing modes are the following ones:

Random aSync addressing: In this mode the content of the address pointer register is updated only in its less significant 16 bits (A1-A16) by the bus apt to the parallel addressing. The update occurs by arranging the configuration of the new address on the basic_bus and by placing the pin PA (PA=1) at the high logic level. The results of the reading are available on the bus I/O 0-7 (0-15) of NAND derivation. Each location addressable with the basic_bus can be reached in the asynchronous mode and it does not require neither commands nor clock pulses. Asynchronous reading of the strings can be carried out by maintaining the pin PA at high logic level '1' in a continuative way or by 'pulsing' pin PA (1_pulse) with intervals being greater than the access time at each address change. The meaning and the weight of each pin within the basic_bus is shown in FIG. 3 with reference to the block with the acronym: basic & a_Sync_addressing. The greatest covering possible is of 1 Mega_bit. This addressing mode is advantageous for fast readings within a memory region where an executive program resides.

Extended Sync Addressing: In this mode the content of the address pointer register is updated only in its 32 less significant bits by the bus apt to the parallel addressing. This update occurs by means of a first loading of the synchronous type, which can advantageously be of the pulsed type, of the most significant part of the vector (A17-A32) with the basic_bus followed by the remaining less significant part (A1-A16) only using the parallel basic_bus. The 'Sync' part is signaled with the simultaneous presence of the control signals PA=1 e #WR=0. On the transition 0-1 di WR, the bits 17-32 of the address register are updated. Once the synchronous step has ended there occurs the asynchronous step with the features of the previous embodiment. The meaning and the weight of each pin within the basic_bus in the two addressing steps is always shown in FIG. 3 with reference to the block with acronym: Extended Sync_addressing. The greatest covering possible is of 64 Giga_bit. This addressing mode is advantageous for wide replacements of the active region within the memory.

Maxi Sync Addressing: In this mode the content of the address pointer register is completely updated in its 40 bits by the joint action of the parallel bus apt to the parallel addressing and by the bus I/O 0-7 of NAND origin. This update occurs by means of a first loading of the synchronous type, which can advantageously be of the pulsed type, of the most significant type of the vector (A17-A40) with the joint use of the basic_bus for the vector part (A17-A32) and of the I/O_bus (0-7) for the remaining part (A33-A40). Afterwards there occurs the update of the remaining less significant part (A1-A16) by using only the parallel basic_bus. The 'Sync' part is signaled with the simultaneous presence of the control signals PA=1, #WR=0, and AL=1. On the transition 0-1 of WR the bits 17-40 of the address register are updated. During the synchronous step the bus I/O is used in the Multiplexed form (as contemplated in the NAND protocol). Once the synchronous stepped has ended there occurs the asynchronous step with the features of the previous embodiment. The meaning and the weight of each pin within the basic_bus in the two addressing steps is shown in FIG. 3 with reference to the block with acronym: Maxi Sync_addressing. The greatest covering possible is of 16 Tera_bit. This addressing mode is advantageous for wide replacements of the active region within a system of memories being the size of the address vector really big.

FIG. 2 summarizes features of the reading cycles, composition, and weight of the vector portions in the different addressing modes.

As it can be easily noted, the first two modes do not require any multiplexing of the addresses in the output pins, as it instead occurs in the traditional NAND architectures.

Among these two protocols the first one is of the asynchronous type and essentially corresponds to a classical asynchronous protocol which allows to address up to 1 Mbit of memory at a speed depending on the features of the selected array portion, for example 100 nsec for the part of the NOR-like type and 20 usec for the NAND part.

The second protocol is of the extended type, and with the addition of a single clock pulse permits addressing up to 64 Gbit by loading an address register with 32 bits in two successive instants (16+16), thus the reading of a generic datum at a speed depending on the contingent array region, for example 100 nsec+clock for the NOR-like type, equivalent to.about. 120 nsec.

In both the first two protocols the outputs are free to switch in the state corresponding to the desired operation and/or cell.

The third protocol, called "maxi", makes use, by means of a multiplexing operation, of the output pins used also for the NAND protocol to address up to at maximum of 16 Tbit.

In two successive instants respectively the address part m (middle) is loaded by means of the address buffer and the M part (most, a 8 bit) is loaded by means of the first output pins <0:7>, afterwards with a clock pulse on the pin AL the register I (least, with 16 bit) is loaded by means of the address pins and the reading is made start with a speed equal to the one of the second protocol.

The third protocol functionally distinguishes itself from the first two ones exactly for the use of the pin AL, which is destined to the definition of the latching operation of the addresses through the output pins.

Hereafter the main features of the reading steps are summarized:

Portion 3 NOR-like tacc: max 100 nsec. random, without limits; 30 nsec. burst & random (in page).

Portion 2 NAND tacc: max 20 usec. random, without limits 30 nsec. burst & random (in page).

All the modify operations of the memory make use of the traditional protocol used in the NAND architectures, and therefore they are not detailed in the description of the present invention.

Operation of the device according to the method of the invention will now be discussed.

Suppose that at the switching on step of a mobile electronic device (cellular, palmtop, camera, etc. . . . ), which incorporates the memory device according to the invention, the content of a part IPL (Initial Program Loader) and of a second part SPL (Secondary Program Loader) of the mobile BIOS should be loaded in a first 1 Mbit portion of the non volatile memory matrix object of the present invention. Such first 1 Mbit portion of program instructions have the peculiarity of allowing a quick access to the cells.

Figure 5:
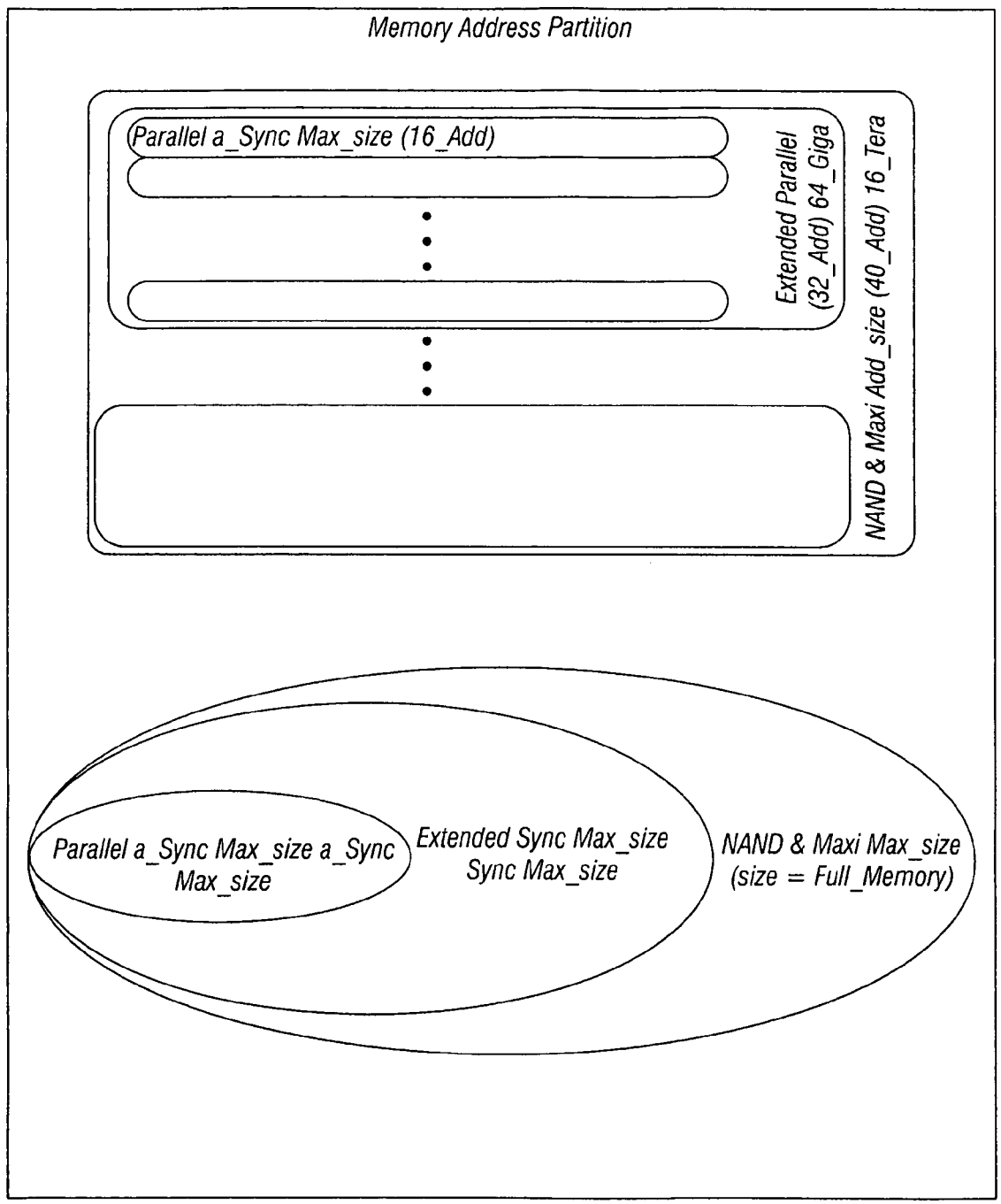
FIG. 5 shows a map representation of the memory part addressed according to the composition of the address vector in the different access modes.

At the start up of the mobile device a reading of the memory is thus performed in the first 1 Mbit locations (FIG. 5), since the address registers (32 or 40 according to the architecture) are: as regards the least part connected directly to the 16 external address pins, as for the middle (and most) parts to zero and reset by the power on reset signal. The reading of these cells occurs at a speed of 100 nsec.

The response speed of the device is thus similar to that required by these boot operations, and thus it does not need RAM loading. In contrast to the most developed existing wireless memory devices, all the read operations performed with the protocol used in the present embodiments do not require additional commands, such as, for example, the "load" of a RAM of normally smaller sizes than the smallest random addressable portion of the present invention (32 Kbit with respect to 1 Mbit).

A further advantage of the described protocol is its flexibility, since it allows the memory reading both with a conventional approach of the NAND type and with an efficient random approach so as to speed up the responses of the fastest portions (portion 3a NOR-like, page buffer). Moreover the passage from a mode to the other occurs without complicated wait cycles, but as function of a single control pin (PA) and it is thus immediate.

In conclusion, the memory device according to the present embodiments realize in a single chip, thus using a single technology, a group of functions up to now obtained only by associating memory chips realized and structured with different technologies. Everything is obtained with a modification of the NAND memory matrix, and it allows the use of a flash NAND structure, substantially substituting a RAM or a ROM, for the start up step. From another point of view, the invention provides a slow NAND structure with random access.

Globally the device and the method according to the present design attain a rich series of advantages listed hereafter:

Reduced costs and low circuit complexity;

Memory areas (higher or equal to two) at different operative speeds, which can be selected by means of row decoding;

Memory areas with at least a full random access part, substantially with NOR modes;

A memory portion which can be used as data storage of greater capacity with respect to the portion apt to the code storage;

NAND protocol for the sectors used for the data and full random access for the part apt to the code XIP;

It makes a RAM unnecessary to execute the code;

Low assembling costs with respect to known solutions Toshiba/Samsung;

Low costs for the user in the case of use of extra chip RAM;

Full technological compatibility with other associated NAND circuits, for example for the realization of memory parts with NOR random access;

Reduction of the capacitive weight of the bit lines by means of decouplers; and

Continuity and sharing of the structures of the NAND areas at different speed.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for accessing a NAND non-volatile memory matrix organized in rows and columns and accessed by word lines and bit lines, respectively, the memory having first and second submatrices with bit lines coupled by a switch device between the first and second submatrices, and with the first submatrix having a faster speed of operation and higher capacity bit lines than the second submatrix, the method comprising:

storing, reading, or deleting code in the first submatrix; and storing, reading, or deleting data in the second submatrix.

2. The method of claim 1 wherein storing, reading, or deleting in the first and second submatrices comprises addressing directly and in parallel by loading an address register in two successive clock pulses.

3. The method of claim 2, comprising updating an address of an address vector in one of three modes: asynchronous, extended, or multi-sequential.

4. The method of claim 1 wherein storing, reading, or deleting code in the first submatrix comprises activating the switch device to uncouple the bit lines.

5. The method of claim 4 wherein the switch device is placed in an OFF condition when storing, reading, or deleting code in the first submatrix.

* * * * *